Figure 1:
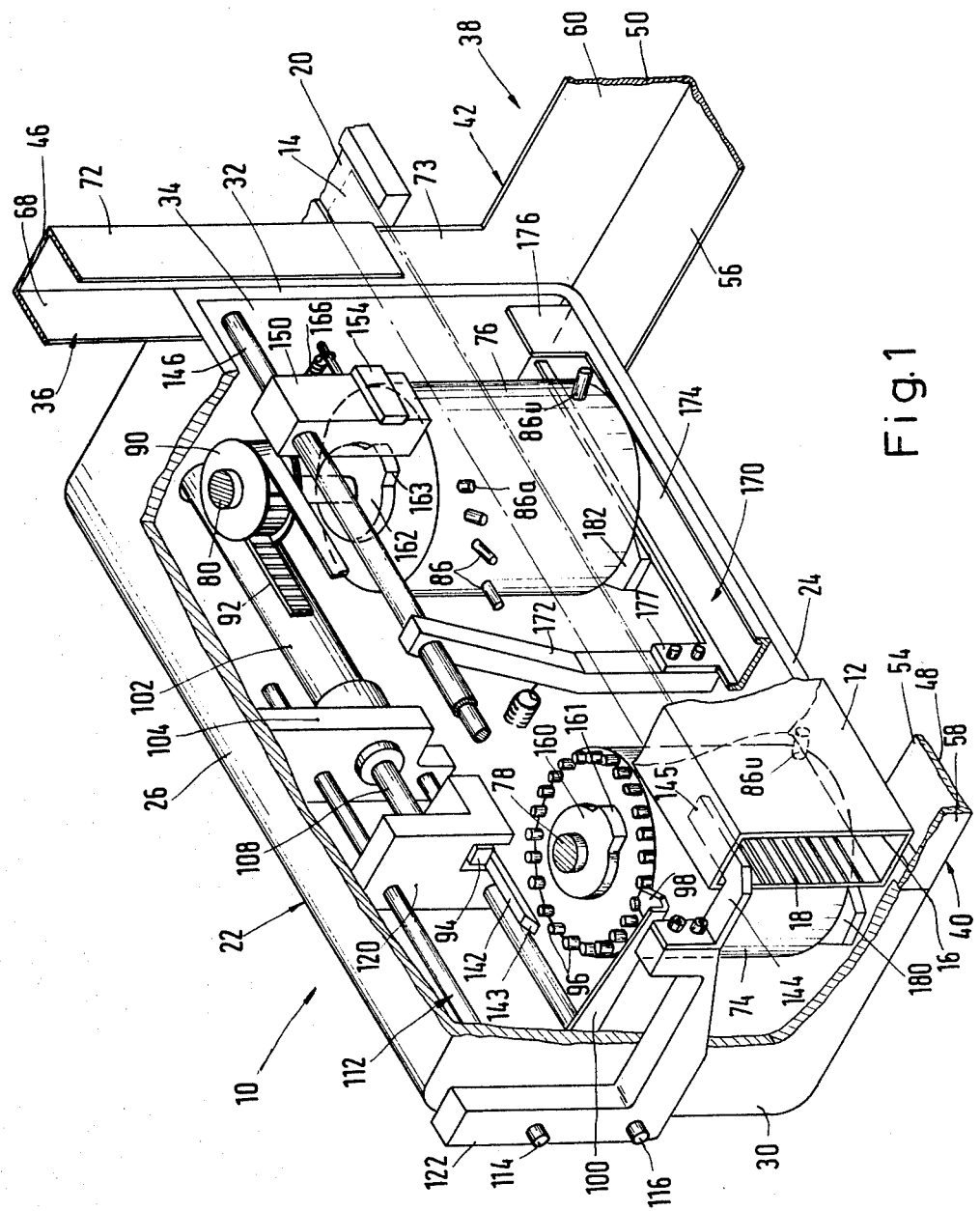

United States Patent

Hoffmann et al.

[11] 4,221,522
[45] Sep. 9, 1980

[54] APPARATUS FOR THE AUTOMATIC STEPWISE DISPLACEMENT AND CHANGING OF MAGAZINES

[75] Inventors: Johann Hoffmann, Freising; Richard Heim, Moosburg; Georg Fischer, Freising, all of Fed. Rep. of Germany

[73] Assignee: Texas Instruments Deutschland GmbH, Freising, Fed. Rep. of Germany

[21] Appl. No.: 931,335

[22] Filed: Aug. 7, 1978

[30] Foreign Application Priority Data

Jun. 6, 1978 [DE] Fed. Rep. of Germany ....... 2824787

[51] Int. Cl.² .............................................. B65B 61/00
[52] U.S. Cl. .................................................... 414/417
[58] Field of Search ............... 414/404, 417, 118, 119, 414/128; 271/9, 64, 173, 131; 74/128

[56] References Cited

U.S. PATENT DOCUMENTS

| | | | |
|---|---|---|---|
| 3,762,581 | 10/1973 | Gabbrielli | 414/417 X |
| 3,921,788 | 11/1975 | Roberson | 414/417 |
| 4,036,381 | 7/1977 | Nielson | 414/417 |

FOREIGN PATENT DOCUMENTS 2336584  2/1974  Fed. Rep. of Germany .

*Primary Examiner*—Robert G. Sheridan
*Assistant Examiner*—Terrance L. Siemens
*Attorney, Agent, or Firm*—N. Rhys Merrett; Melvin Sharp; Gary C. Honeycutt

[57] ABSTRACT

A vertical magazine well accommodates a plurality of magazines lying on each other so that they can move downwardly under the action of gravity. Each magazine accommodates a plurality of strip-like workpieces at predetermined intervals above each other and which at a withdrawal or loading station level can be withdrawn from or inserted into the magazine by displacement in a longitudinal direction. Accommodated in the magazine well is a pair of cylindrical drums having vertical axes about which they are rotated in synchronism with each other by a step-drive mechanism. The surface of each drum has a helical array of pins projecting radially therefrom and which can be projected in turn into the vertical path of movement of a magazine in the magazine well. Initially, a magazine is supported by the uppermost pins of the helical arrays of the two drums and in this position the lowermost strip-like member in the magazine can be withdrawn from (or loaded into) the magazine at the loading station. Successive step rotation of the drums transfers the magazine to succeedingly lower pins of the helical arrays allowing successive strip-like members to be withdrawn from (or inserted into) the magazine. When the magazine rests on the lowermost pins of the two helical arrays, the next rotation step releases the magazine permitting it to be released from the magazine well and a following magazine to be supported by the uppermost pins of the two helical arrays for a loading or unloading operation to be carried out. Magazines can thus be unloaded or loaded in an automatic manner with automatic magazine changing involving substantially no loss of time.

23 Claims, 4 Drawing Figures

APPARATUS FOR THE AUTOMATIC STEPWISE DISPLACEMENT AND CHANGING OF MAGAZINES

The invention relates to an apparatus for automatic stepwise displacement and changing of magazines, each of which comprises a magazine frame of rectangular cross-section which is formed for accommodating a plurality of strip-like workpieces at predetermined intervals above each other which at a withdrawal or loading station lying at a predetermined level are to be withdrawn from or inserted into the magazine by displacement in the longitudinal direction.

Magazines of this type are used in particular in automated mass production when workpieces are to be processed in large number in succession in various fabricating machines. With each magazine a large number of workpieces can be transferred from one machine to the other, withdrawn individually in succession from the magazine and sent through the fabricating machine and after processing again introduced into a magazine of the same type. For this purpose, the magazines must be displaced stepwise so that the workpieces are brought in succession exactly to the level of the withdrawal or charging station. This requires considerable accuracy of the displacing or indexing means. Furthermore, when a magazine is completely empty or full it must be replaced by a new magazine. For this purpose, the indexing means must be returned to its initial position.

An object of the invention is to provide an apparatus of the above-mentioned type by means of which the required accuracy in the indexing of the magazines can economically be attained, and furthermore which permits automatic magazine changing substantially without loss of time.

Apparatus according to the invention includes a vertical magazine well for receiving a plurality of magazines lying on each other which is so constructed that the magazines can move downwardly under the action of gravity. At least one stop means is provided, rotatable about a vertical axis with supports disposed along a helical line at equal angular intervals. The supports are arranged at equal vertical intervals which are equal to the intervals between the workpieces in the magazines, and at least one of the supports projects into the path of movement of the magazines disposed in the magazine well. A stepping drive means on each actuation rotates each stop means by an angle which corresponds to the angular interval of the support along the helical line.

In an apparatus embodying the invention the positions which each magazine assumes in succession in the magazine well are defined by the vertical location of the supports on the stop means and the indexing step is defined exactly by the vertical intervals between the supports. On the other hand, it is not necessary to maintain an exact angle of rotation of the stop means provided the magazine rests on the correct support. Furthermore, due to the arrangement of the supports along a helical line during the stepwise rotation of the stop means the uppermost support returns automatically into the path of movement of the magazines in the magazine well, thus reaching the starting position for the next magazine. Thus, no time is lost in bringing the apparatus to the starting position again after emptying or loading of a magazine.

Several magazines may be introduced into the magazine well and they are then moved automatically in succession stepwise past the withdrawal or charging station. If these magazines rest directly on each other steps must be taken to ensure that the uppermost support can enter between two magazines. According to a preferred embodiment of the invention this is done by at least one holding means arranged above the stop means or the plurality of stop means which engages on actuation the magazine disposed at its level in the magazine well and thus prevents its downward movement. An actuating means for the holding means is driven synchronously with the stop means and actuates the holding means before the bottom side of the second lowest magazine in the well has reached the level of the uppermost support of the stop means and renders the holding means inoperative when the uppermost support has entered the path of movement of the magazines.

Figure 2:
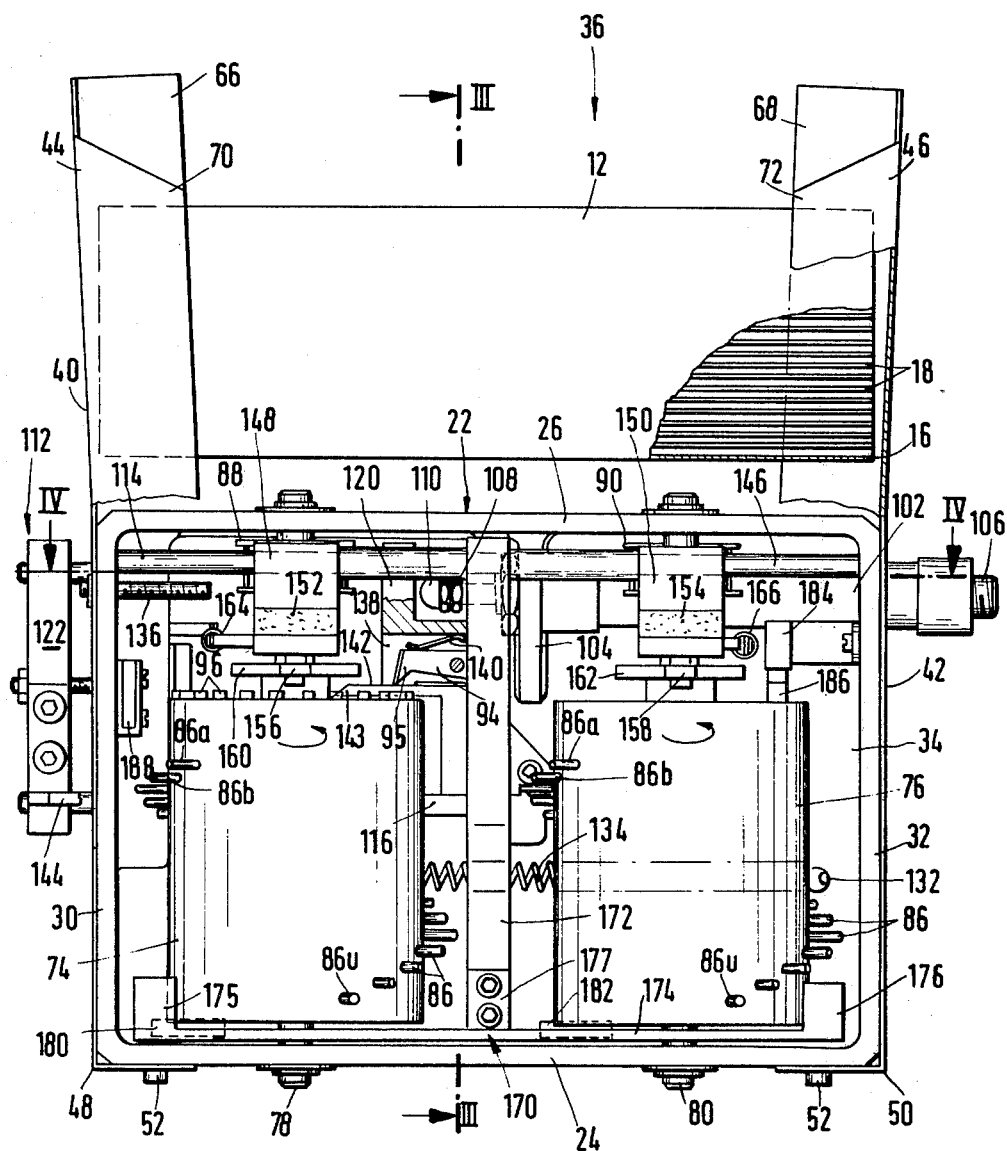
Figure 3:
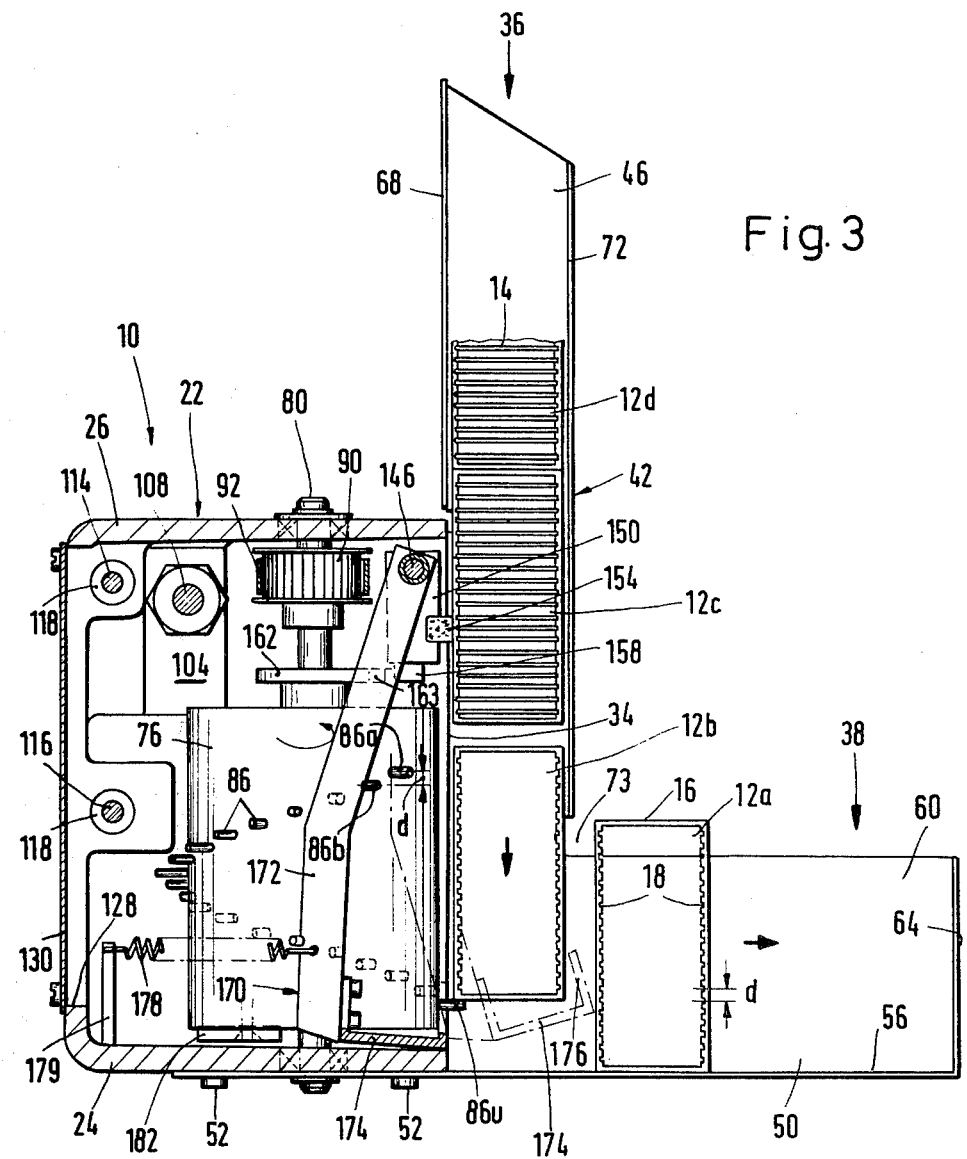
Figure 4:
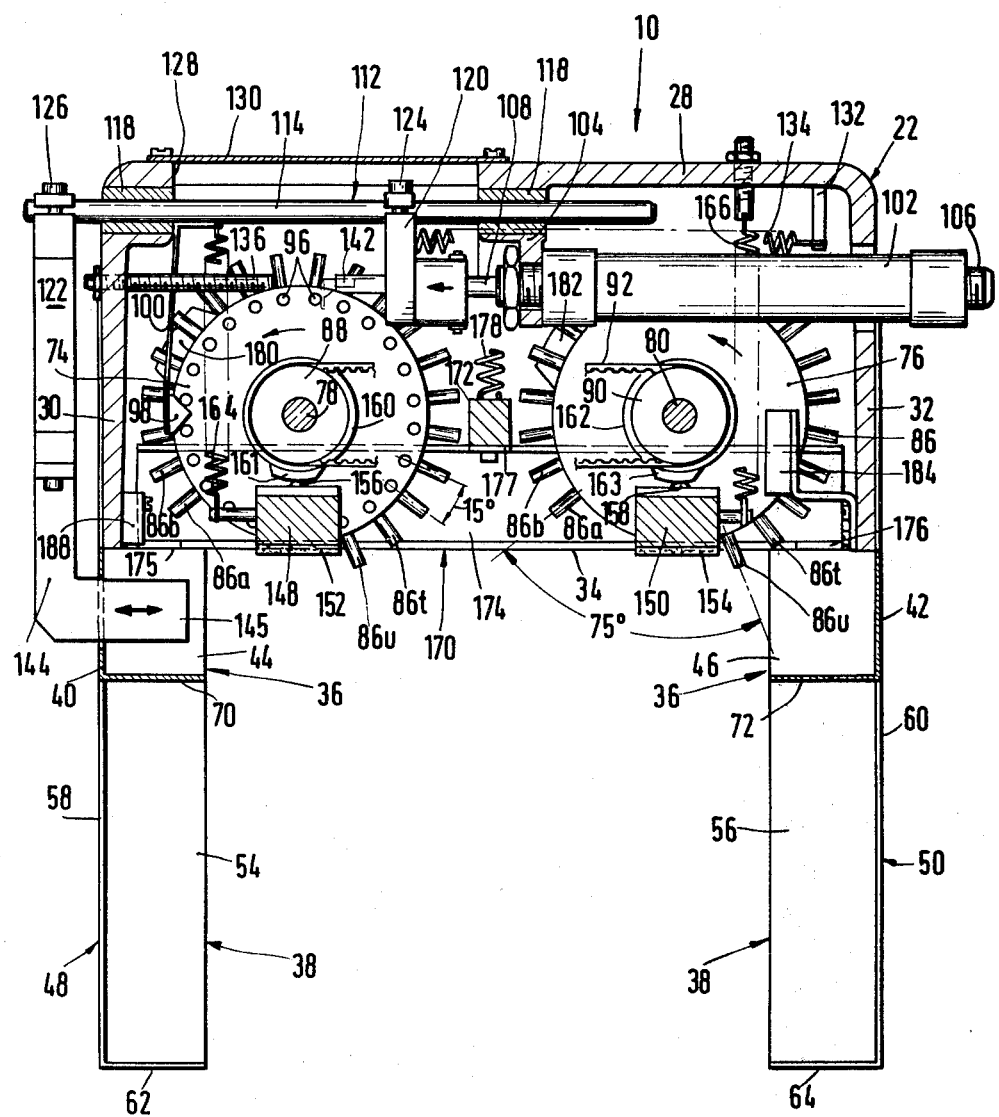

Further features and advantages of the invention are apparent from the following description of an example of embodiment with the aid of the drawings, wherein:

FIG. 1 is a very diagramatical perspective view of an apparatus according to the invention, FIG. 2 is a front view of the apparatus with partially removed magazine well, FIG. 3 is a lateral sectional view along the line III—III of FIG. 2, and FIG. 4 is a plan view of the apparatus substantially along the line IV—IV of FIG. 2.

The apparatus 10 shown in the drawings serves for automatic displacement and changing of magazines 12 of the type shown in FIGS. 2 and 3. In FIG. 2 a full magazine 12 is shown in front elevation, partially broken away, at the time of introduction into the apparatus 10, and FIG. 3 shows two empty magazines 12a, 12b and two full magazines 12c, 12d. These magazines are intended for receiving strip-like workpieces 14 which are to be processed in automatic fabricating machines. A preferred field of application of the magazines is the handling of lead frame strips in semiconductor fabrication. As is known, semiconductor components, such as transistors or integrated circuits, are made in the form of small rectangular semiconductor bars which are secured individually to metal lead frames with which they are usually subsequently encapsulated in housings. To facilitate handling the individual lead frames are initially stamped from sheet metal so that a large number of them are held together by longitudinal lateral strips which are cut in a subsequent fabrication stage. A large number of these lead frame strips is accommodated in a magazine 12; in these magazines the lead frame strips are brought during the various fabrication stages to the processing machines, removed individually in succession from the magazine and after processing again introduced into a magazine of the same type. The lead frame strips disposed in the magazines may thus be at different stages of fabrication.

Each magazine consists of an elongated tubular metal frame 16 of rectangular cross-section whose length corresponds substantially to the length of the lead frame strip 14. The magazine frame 16 is open at the two end sides and along its longitudinal walls longitudinal grooves 18 are formed at the insides at equal intervals d (FIG. 3). A lead frame 14 may be introduced into the magazine or removed therefrom in the longitudinal direction through the open end face into two longitudinal grooves 18 at the same level. Each magazine illustrated has 20 pairs of longitudinal grooves 18 and is thus adapted to receive 20 lead frame strips 14.

FIG. 1 shows diagramatically a portion of the advancing or indexing path 20 for the lead frame strips 14 in a fabricating machine. The lead frame strips must be individually removed in succession from the magazines 12 and inserted into the indexing path 20; they are engaged there by an automatic indexing means, not illustrated, and fed to the fabricating machine.

The apparatus 10 performs two functions:
1. It displaces each magazine 12 stepwise in the vertical direction so that the lead frame strips 14 contained in the magazine are individually brought successively to the level of the indexing path 20, and it inserts the lead frame strip 14 disposed at the level of the indexing path 20 into the latter to such an extent that it can be engaged by the indexing means;
2. When a magazine 12 is empty, it changes this magazine automatically for a full magazine which is then displaced stepwise in the same manner.

The apparatus comprises a housing 22 in the form of a right parallelepiped having a bottom 24, a top 26, a rear wall 28 and two end walls 30, 32. The front side 34 of the housing is open. The length of the housing 22 corresponds substantially to the length of a magazine 12.

In front of the open front side 34 of the housing 22 a vertical magazine well 36 is disposed which can accommodate a plurality of superimposed magazines 12 (such as the magazines 12b, 12c, 12d in FIG. 3) which tend to move downwardly in the magazine well 36 under the action of gravity. Adjoining the lower end of the magazine well 36 is a magazine support 38 projecting horizontally forwardly from the housing 22. The magazine well 36 and the magazine support 38 are formed by two punched and stamped sheet metal parts 40, 42 which are mounted on the two end walls 30, 32 of the housing 22. Each sheet metal part has a U-shaped section portion 44, 46 which projects upwardly beyond the housing 22 and the internal cross-section of which is slightly greater than the width of a magazine; said U-shaped section portions face each other with their open sides and form together the vertical magazine well 36. The U-shaped section portions 44, 46 may diverge slightly upwardly (FIG. 2) to facilitate introduction of the magazines 12.

In the lower region of each sheet metal part 40, 42 a horizontal angled section 48 and 50 is formed which projects T-shaped on both sides from the associated U-shaped section portion 44 and 46 respectively. The portion of each angled section 48, 50 facing the housing 22 serves for mounting the sheet metal part 40, 42 on the housing; the vertical leg of the angled section bears on the outside of the corresponding end wall 30 and 32 and the horizontal leg engages the lower side of the bottom 24 and is secured thereto by means of screws 52. The portions of the angled sections 48, 50 projecting forwardly from the housing 22 form together the magazine support 38 serving as support surfaces 54, 56 for the deposited magazines 12 (FIG. 3) and the vertical legs forming side walls 56, 58. At the front end of each angled section 48, 50 is an end wall 62, 64 which prevents the empty magazines pushed onto the magazine support 38 from dropping down.

The sheet metal parts 40, 42 are mounted on the housing 22 so that the rear legs 66, 68 of the two U-shaped sections 44, 46 lie substantially in a plane with the open front side 34 of the housing 22; the magazines 12 disposed in the well 36 thus pass at a slight distance in front of the open front side 34 (FIG. 3). These rear legs 66, 68 terminate at the top of the housing 22. The front legs 70, 72 of the two U-shaped sections 44, 46 extend however further downwardly; they terminate at a distance from the support surfaces 54, 56 of the magazine support 38 which is slightly greater than the height of a magazine 12 so that a magazine 12 resting on the support surfaces 54, 56 can be pushed through the openings thus formed (of which the opening 73 is visible in FIGS. 1 and 3) out of the magazine well 36 onto the magazine support 38.

For the stepwise downward movement of the magazines 12 in the well 36 two drums 74, 76 are mounted rotatably about vertical axes in the housing 22. Each drum is mounted on a shaft 78, 80 which is rotatably mounted in the housing bottom 24 and the housing top 26. The peripheral surface of each drum 74, 76 lies a very small distance from the plane of the open front side 34 of the housing 22.

Each drum 74, 76 is provided with a row of radially projecting pins 86 which are distributed at uniform angular intervals along a helical line round the drum periphery. The number of pins 86 corresponds to the number of longitudinal groove pairs 18 in each magazine 12; thus, in the example illustrated 20 pins 86 are provided on each drum 74, 76. The vertical distance between two successive pins 86 is exactly the same as the vertical distance d between centers of two longitudinal grooves 18 of the magazine 12. The angular intervals of the pins 86 are so dimensioned that the helical line described by the pins does not quite extend round the drum periphery. In the example of embodiment illustrated (FIG. 4) the angular interval between two successive pins is 15° so that the 20 pins 86 extend over an angular distance of 285° and an angular distance of 75° is free from pins.

The pins 86 have a length such that in every position of the drums 74, 76 at least one of them projects into the path of movement of the magazines 12 contained in the magazine well 36 except for when the angular distance of 75° free from pins happens to be facing the open front side 34. In the position of the two drums 74, 76 illustrated in FIG. 4 the last lowermost pin 86u of each drum projects into the path of movement of the magazines whilst the preceding pin 86t is just withdrawn from said path of movement. When the drums are rotated out of the position illustrated in FIG. 4 through an angle of 15° in anti-clockwise direction no pin will project into the path of movement of the magazine; the last pin 86u is then also retracted from the path of movement and the first uppermost pin 86a has not quite entered the path of movement. On further rotation through 15° the uppermost pin 86a then enters the path of movement. If the two drums 74, 76 are rotated more than four steps out of the position of FIG. 4 in the anticlockwise direction four pins 86 will project into the path of movement of the magazines in the magazine well, the uppermost pin of which assumes the position occupied by the pin 86u in FIG. 4. The lowermost magazine 12 disposed in the well 36 rests with its bottom side on said pin so that it is prevented from downward movement.

Mounted on each drum shaft 78, 80 is a toothed pulley 88 and 90 respectively and the two pulleys are connected together by a toothed belt 92 so that the two drums 74, 76 are always rotated completely synchronously and their pins 86 always assume the same positions.

The stepwise rotation of the drums 74, 76 is effected by an indexing pawl 94 cooperating with ratchet pins 96 mounted on the top of the drum 74. The ratchet pins are also attached at angular intervals of 15° but without any gap so that twenty-four ratchet pins 96 are present. On each actuation of the indexing pawl 94 the two drums 74, 76 are rotated through a pin interval, i.e. an angle of 15°. A detent nose 98 with triangular profile mounted on a leaf spring 100 and engaging between two detent pins 96 ensures the exact locating of the drums after each indexing step.

As drive motor for the indexing pawl 94 a pneumatic cylinder 102 is provided which is mounted on a wall portion 104 projecting inwardly from the rear wall 28 of the housing 22 and is provided at the end projecting outwardly from the housing 22 with a connection 106 for a compressed-air hose. The piston rod 108 projecting from the pneumatic cylinder 102 is provided at the end with a push member 110 which acts on a carriage 112 displaceably mounted in the housing 22 parallel to the rear wall 28. The carriage 112 has two parallel slide rods 114, 116 which are slideably mounted in sliding bearings 118 in the wall portion 104 and in the end wall 30. The slide rods 114, 116 are connected together on the one hand inside the housing 22 by a pawl carrier 120 and on the other hand at the ends projecting from the housing by a support angle 122. Both the pawl carrier 120 and the support angle 122 may be adjusted by means of clamp screws 124, 126 relatively to the slide rods 114, 116, permitting an exact adjustment of these parts. An opening 128 in the rear wall, sealed by a screwed-on plate 130, permits access to the clamp screws 124 of the pawl carrier. A return spring 134 anchored on the one hand to the carriage 112 and on the other to a pin 132 fixed with respect to the housing tends to pull the carriage permanently into the inoperative position illustrated in the drawing in which the carriage 112 is closest to the pneumatic cylinder 102. An adjustable stop screw 136 cooperating with the end face of the pawl carrier 120 remote from the pneumatic cylinder 102 limits the stroke of the carriage 112 in the opposite direction.

The pawl carrier 120 has a cutout 138 in which the indexing pawl 94 is pivotally mounted about a horizontal axis. A lift spring 140 presses the indexing pawl 94 downwardly. In the retracted position of the carriage 112 the nose 95 of the pawl 94 bears on a guard 142 which is mounted fixed with respect to the housing parallel to the path of movement of the carriage 112 and has a bevelled front edge 143. The guard 142 is so dimensioned that it does not release the pawl 94 until shortly before the end of the movement of the carriage 112 so that the nose 95 of the pawl 94 can come into engagement with the next ratchet pin 96 of the drum 74 lying in front of the end of the guard 142. The remaining travel of the pawl 94 is dimensioned exactly so that the drum 74 is further rotated through one pin, i.e. through an angle of 15°. In the subsequent return movement of the carriage 112 the nose 95 of the pawl 94 then again slides on the guard 142.

A flat ejector 144 is detachably mounted on the support angle 122 secured outside the housing 22 on the slide rods 114, 116. The ejector has a perpendicularly projecting push member 145 which lies on the same height as the indexing path 20 and the width of which is so dimensioned that it can enter a magazine 12. When the push member 145 moves into a magazine 12 disposed in the magazine well 36 it encounters the end of the lead frame strip 14 which is at the level of the indexing path 20 so that it pushes said lead frame strip 14 a short distance out of the magazine 12 into the indexing path 20 as indicated in FIG. 1.

Arranged parallel to the open front side 34 near the top 26 of the housing 22 is a support rod 146. On the support rod 146 two brake blocks 148, 150 are pivotally mounted in each case in front of one of the two drum shafts 78, 80. Each brake block 148 or 150 is provided at the face facing the open front side 34 with a projecting friction lining 152, 154 which lies at a certain distance below the pivot axis. Mounted on each brake block 148, 150 is a downwardly projecting cam follower 156, 158 which bears on a cam 160, 162 carried by the associated drum shaft 78, 80. For each brake block a spring 164, 166 is provided which is anchored on the one hand to the brake block and on the other to the housing 22 and pulls the brake block back so that the cam follower 156, 158 bears permanently on the cam 160, 162. Each cam 160, 162 is formed so that during the major part of the drum revolution the brake blocks 148, 150 are retracted from the magazine well 36 and thus do not impair the free downward movement of the magazines 12. When on the other hand the cam followers 156, 158 move onto a raised portion 161, 163 of the cams 160, 162 the brake blocks 148, 150 are pivoted forwardly to the magazine well 36 so that the friction linings 152, 154 engage the magazine 12 which is just at the level of the brake blocks; this prevents the further downward movement of said magazine (and of any other magazines resting thereon).

Between the two brake blocks 148, 150 a pusher 170 for the magazines 12 is pivotally mounted on the support rod 146. The pusher 170 consists of a somewhat angled support lever 172 which extends between the two drums 74, 76 over almost the entire height of the housing 22 and which is mounted at the upper end pivotally on the support rod 146, and a pusher plate 174 secured to the lower end of the support lever 172. The pusher plate comprises at the longitudinal edge facing the open front side 34 of the housing 22 at each end an extension 175, 176 bent at right-angles upwardly and at the centre of the opposite edge a likewise perpendicularly upwardly bent extension 177 which is screwed to the lower end of the support lever 172. A spring 178 anchored on the one hand to the support lever 172 and on the other to a pin 179 secured on the housing bottom 24 tends to pull the pusher 170 into the retracted position (illustrated in FIG. 3 in full lines). In this position the pusher plate 74 lies in the intermediate space between the lower end faces of the two drums 74, 76 and the housing bottom 24 and its front edge with the projecting extensions 175, 176 is completely retracted from the path of movement of the magazines in the magazine well 36. Secured to the lower side of each drum 74, 76 is a cam member 180, 182 which engages in a predetermined angular region of the drum revolution on the rear edge of the pusher plate 174 and pivots the pusher 170 forwardly about the pivot axis so that the pusher extensions 175, 176 are displaced into the path of movement of the magazines 12. If a magazine 12 is disposed on the support surfaces 54, 56 it is engaged by the pusher extensions 175, 176 and displaced horizontally onto the magazine support 38 as indicated in dashed line in FIG. 3. When on further rotation of the drums 74, 76 the cam members 180, 182 move away from the housing front side 34 again the pusher 170 is retracted by the spring 178 into the housing 22.

Above the drum 76 a microswitch 184 is mounted on the housing 22 and is actuated by a finger 186 mounted on the top of the drum at a predetermined angular position of the drum 76. The microswitch 184 thus supplies a signal for a predetermined drum position. Mounted on the end wall 30 substantially at the level of the top of the drums 74, 76 is a further microswitch 188 so that it is actuated when a magazine is disposed in the magazine well 36 at this level. The signals supplied by the microswitches 184, 188 are used to control the operating cycles of the apparatus.

The mode of operation of the apparatus 10 is easily understood from the previous description of its construction. To start the apparatus, the drums 74, 76 are brought into the position in which the uppermost pins 86a assume the position occupied by the pin 86u in FIG. 4. In this drum position the two brake blocks 148, 150 are in the retracted position. The carriage 112 is displaced to the left either manually or by actuation of the pneumatic cylinder 102 so that the push member 145 is withdrawn completely from the path of movement of the magazines 12 in the well 36. One or more magazines 12 are now introduced into the well 36, the lowermost magazine coming to bear with its bottom side on the uppermost pins 86a of the two drums 74, 76. In this position of the lowermost magazine the lowermost lead frame strip 14 contained in the magazine lies just at the level of the indexing path 20. When the carriage 112 is subsequently again moved to the right under the action of the return spring 134 the push member 145 engages said lowermost lead frame strip 14 and pushes it a short distance into the indexing path 20. There it is engaged by the indexing means, not illustrated, and intermittently advanced in time with the fabricating machine. A sensor, not illustrated, on the indexing path 20 furnishes a signal when a new lead frame strip is required. A control means, not illustrated, executes an operating cycle on the basis of this signal, during which the magazine 12 is lowered by a magazine division d and the next lead frame strip is inserted into the indexing path 20.

At the start of the operating cycle a valve is opened through which compressed air is supplied to the pneumatic cylinder 102 so that the piston rod 108 moves out of the pneumatic cylinder 102 and pushes the carriage 112 to the left until abutment on the stop screw 136. During this displacement the push member 145 of the ejector 144 is moved out of the magazine. The indexing pawl 94 does not come into action during this first part of the displacement movement because it slides on the guard 142. Only in the last part of the displacement movement of the carriage 112, after the push member 145 has already completely left the magazine 12, does the indexing pawl 94 engage a ratchet pin 96 on the top of the drum 74, thus rotating the two drums 74, 76 through one step, i.e. an angle of 15°, in the anticlockwise direction (FIG. 4). By this rotational movement the two pins 86a on which the magazine 12 was lying are moved out of the path of movement of the magazine and the magazine drops onto the next lower pin 86b of each drum; it is thus moved downwardly through exactly one magazine division d. The second magazine resting on the lowermost magazine and all other magazines which may be in the well thereabove also take part in this downward movement.

Thereafter, in the same operating cycle the compressed-air supplied to the pneumatic cylinder 102 is interrupted and the interior thereof connected to the atmosphere. The return spring 134 can thus retract the carriage 112 into the inoperative position. In this rearward movement the push member 145 enters the magazine 12 and meets the end of the next lead frame strip 14 which has now been brought to the level of the indexing path 20, pushing said strip into said path 20. The next lead frame strip has thus been brought into the path 20 for advancing and processing.

The same operation is repeated each time a new lead frame strip is required, the lowermost magazine being moved downwardly stepwise in the well 36 and emptied from the bottom.

Shortly before the lowermost magazine (for example the magazine 12b in FIG. 3) approaches the lowest position the cam followers 156, 158 of the two brake blocks 148, 150 run onto the raised portions 161, 163 of the cams 160, 162, the brake blocks 148, 150 thereby being pivoted forwardly so that the friction linings 152, 154 engage the second lowest magazine (i.e. the magazine 12c in FIG. 3) and prevent the downward movement thereof. From now on the second lowest magazine 12c and the further magazines disposed in the well (such as the magazine 12d in FIG. 3) cannot follow the downward movement of the lowermost magazine 12b so that a gap forms between the top of the lowermost magazine 12b and the bottom of the second lowest magazine 12c. This gap is important to enable the uppermost pins 86a of the drums 74, 76 to enter beneath the second lowest magazine 12c.

When the lowermost magazine 12b is released by the lowermost pins 86u of the drums 74, 76 it drops onto the support surfaces 54, 56 of the magazine support 38. At the same time, the finger 186 actuates the microswitch 184 which furnishes a signal which effects the execution of four indexing steps by the pneumatic cylinder 102 in rapid succession. This further rotates the two drums 74, 76 by four pin divisions, bringing the uppermost pin 86a of each drum into the position occupied by the pin 86u in FIG. 4. During this rapid indexing through four steps the cam members 180, 182 also engage the pusher plate 174, the pusher 170 thus being pivoted outwardly and pushing the empty magazine on the surfaces 54, 56 into the magazine support 38 so that it is completely moved out of the path of movement of the following magazines in the well 36; this is shown in FIG. 3 for the empty magazine 12a, the pusher being indicated in dot-dash lines. Shortly before completion of the four rapid indexing steps the cam followers 156, 158 of the brake blocks 148, 150 leave the raised portions 161, 163 of the cams 160, 162 again so that the brake blocks 148, 150 are retracted and the now lowermost magazine 12c drops onto the uppermost pins 86a of the two drums 74, 76. During the four indexing steps of this rapid sequence no downward movement of the magazines takes place because the lowermost magazine remains resting on the uppermost pins 86a; however, the lowermost lead frame strip 14 is inserted out of the lowermost magazine by the push member 145 of the ejector 144 into the indexing path 20 as soon as this magazine rests on the pins 86a after the releasing of the brakes.

The previously described operations are repeated for the next magazine which is moved downwardly stepwise, and after each downward step the next lead frame strip is inserted into the indexing path. When this magazine is also empty it is pushed by the pusher into the magazine support and the next magazine is engaged by the drums for the stepwise downward movement. All operations take place automatically; it is merely necessary to ensure that an adequate supply of filled magazines is always present in the magazine well.

The same apparatus may also be arranged at the other end of the indexing path to introduce the lead frame strips into magazines of the same type again. The sole difference is that in this case no ejector is required for the lead frame strips; the ejector 144 is then simply removed from the support angle 122.

Instead of the magazine support 38 onto which the empty magazines are pushed by the pusher 170, the magazine well 36 may simply be open towards the bottom or provided with a chute so that the empty magazines drop out of their own accord as soon as they are released by the lowermost pin 86u. The pusher 170 is then of course not provided either.

The use of two drums 74, 76 is expedient when the magazines have an appreciable length because the provision of two support points prevents tilting of the magazines in the magazine well. For short magazines a single drum may be adequate.

What is claimed is:

1. Apparatus for automatic stepwise displacement of magazines, each of which comprises a magazine frame of rectangular cross-section which is formed for accommodating a plurality of strip-like workpieces at predetermined intervals above each other, which workpieces at a withdrawal or loading station lying at a predetermined level are to be withdrawn from or inserted into the magazine by displacement in the longitudinal direction, comprising a vertical magazine well means for receiving a plurality of said magazines lying on each other to permit movement of the magazines downwardly under the action of gravity; at least one stop means rotatable about a vertical axis and incorporating a plurality of supports disposed along a helical line at equal angular intervals, at least one said supports projecting into the path of movement of the magazines when disposed in the magazine well means, said supports arranged at equal vertical intervals which are equal to said interval between the workpieces in the magazines; and by stepping drive means for actuation on each step to rotate each stop means by an angle which corresponds to the angular interval of the supports along said helical line.

2. Apparatus according to claim 1, wherein there are two of said stop means arranged parallel and adjacent each other, and said stepping drive means drives said two stop means in synchronism with each other.

3. Apparatus according to claim 1, wherein said stop means comprises a cylindrical drum rotatably mounted about said vertical axis, and said supports are formed by radial projections which are disposed on the surface of the drum along said helical line.

4. Apparatus according to claim 3, wherein said projections comprise pins projecting radially from the surface of the drum.

5. Apparatus according to claim 3, wherein said stepping drive means comprises a reciprocating indexing pawl which engages a ratchet toothing mounted on said drum.

6. Apparatus according to claim 5, wherein said ratchet toothing comprises axially projecting pins mounted on an end face of the drum.

7. Apparatus according to claim 5, wherein said drive means imparts a reciprocating movement to the indexing pawl on each actuation.

8. Apparatus according to claim 7, wherein said drive means is a pneumatic cylinder.

9. Apparatus according to claim 5, including push member means disposed at said level of the withdrawal or charging station and connected to the indexing pawl for synchronous actuation to enter the magazine and displace a said workpiece disposed at said level.

10. Apparatus according to claim 1, including at least one holding means which is disposed above said stop means for actuation to engage a said magazine disposed at its level in the magazine well and prevent downward movement of said magazine, actuating means for the holding means; means for driving said actuating means synchronously with said stop means for actuating said holding means before the lower side of the second lowest magazine in the magazine well has reached the level of an uppermost support of said stop means, and for rendering the holding means inoperative when said uppermost support has entered the path of movement of said magazines in said magazine well means.

11. Apparatus according to claim 10, wherein said holding means comprises friction brake means for engaging the side face of the magazine.

12. Apparatus according to claim 10, wherein said actuating means comprises a cam driven synchronously with said stop means.

13. Apparatus according to claim 1, including means for removing a magazine released by the lowermost support of each stop means out of said magazine well.

14. Apparatus according to claim 13, wherein the magazine well means comprises at its lower end support surface means for a magazine released by said stop means and a lateral discharge opening; reciprocating pusher means; and means for activating said pusher means to engage a magazine resting on said support surface means and push said magazine through the discharge opening out of the magazine well.

15. Apparatus according to claim 14, including means for driving said actuating means for the pusher means synchronously with said stop means.

16. Apparatus for automatic stepwise displacement of magazines for accommodating strip-like workpieces with respect to a station level at which a said strip-like workpiece is to be withdrawn from or loaded into said magazine by displacement in a longitudinal direction of said workpiece, said magazines formed for accommodating a plurality of said strip-like workpieces at predetermined intervals above each other; comprising vertical magazine well means for receiving a plurality of said magazines lying on each other so that the magazines can move downwardly under the action of gravity; a pair of adjacent stop means rotatable about respective vertical axes arranged parallel to each other; each said stop means incorporating a helical array of equi-angularly spaced supports arranged at equally vertical intervals equal to said predetermined intervals between workpieces in said magazines, at least a corresponding one of said supports of both of said stop means projecting into the path of movement of said magazines when disposed in the magazine well means; at least one holding means disposed at a level above said stop means for actuation to engage a said magazine disposed at said level in the magazine well and prevent downward movement of said engaged magazine; step drive means for rotation of said stop means about said vertical axis in synchronism with each other in steps corresponding to the angular interval between said equi-angularly spaced supports; and means for driving said actuating means in synchronism with said stop means for operating said holding means to engage a magazine located in said well means immediately above said stop means before the lowermost surface of the engaged magazine has reached the level of an uppermost support of each of said stop means and for rendering said holding means inoperative when said uppermost supports have entered the path of movement of said magazines in said magazine well means.

17. Apparatus according to claim 16, wherein each said stop means includes a drum having a cylindrical surface and members extending radially outward from said surface to define said helical array of supports of that stop means.

18. Apparatus according to claim 16, wherein said stepping drive means comprises means for positively step driving one of said stop means, and positive drive coupling means coupling said pair of stop means.

19. Apparatus according to claim 18, wherein said positive step drive means comprises pawl and ratchet stepping means.

20. Apparatus according to claim 16, including push member means disposed at said station level, and means driveably coupling said push member means with said positive drive means for actuation in synchronism therewith to enter the magazine and displace a said workpiece disposed at said station level.

21. Apparatus for automatic stepwise displacement and changing of magazines for accommodating strip-like workpieces with respect to a station level at which a said strip-like workpiece is to be withdrawn from or loaded into said magazine by displacement in a longitudinal direction of said workpiece, said magazines formed by accommodating a plurality of said strip-like workpieces at predetermined intervals above each other; comprising vertical magazine well means for receiving a plurality of said magazines lying on each other so that the magazines can move downwardly under the action of gravity; a pair of adjacent stop means rotatable about respective vertical axis arranged parallel to each other; each said stop means incorporating a helical array of equi-angularly spaced supports arranged at equally vertical intervals equal to said predetermined intevals between workpieces in said magazines, at least a corresponding one of said supports of both of said stop means projecting into the path of movement of said magazines when disposed in the magazine well means; at least one holding means disposed at a level above said stop means for actuation to engage a said magazine disposed at said level in the magazine well and prevents downward movement of said engaged magazine; step drive means for rotation of said stop means about said vertical axis in synchronism with each other in steps corresponding to the angular interval between said equi-angularly spaced supports; and means for driving said actuating means in synchronism with said stop means for operating said holding means to engage a magazine located in said well means immediately above said stop means before the lowermost surface of the engaged magazine has reached the level of an uppermost support of each said stop means and for rendering said holding means inoperative when said uppermost supports have entered the path of movement of said magazines in said magazine well means; and means for receiving a magazine released by operation of said step drive means to rotate said stop means and withdraw a lowermost support of each stop means from engagement with a magazine into a position in which it does not project into said path of movement.

22. Apparatus according to claim 20, wherein said magazine well means comprises at its lower end a support surface means for a magazine released by said lowermost supports and a discharge opening; magazine removal means; and means for operating said magazine removal means to engage a magazine resting on said support surface means and transport said magazine through said discharge opening out of the magazine well.

23. Apparatus according to claim 22, including means for driving said magazine removal means in synchronism with said stop means.

* * * * *